United States Patent
Yang et al.

(10) Patent No.: US 8,966,331 B2
(45) Date of Patent: Feb. 24, 2015

(54) TEST CIRCUIT OF SEMICONDUCTOR MEMORY APPARATUS AND SEMICONDUCTOR MEMORY SYSTEM INCLUDING THE SAME

(71) Applicant: SK Hynix Inc., Icheon-si Gyeonggi-do (KR)

(72) Inventors: Hyung Gyun Yang, Icheon-si Gyeonggi-do (KR); Hyung Dong Lee, Icheon-si Gyeonggi-do (KR); Yong Kee Kwon, Icheon-si Gyeonggi-do (KR); Young Suk Moon, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/709,644

(22) Filed: Dec. 10, 2012

(65) Prior Publication Data

US 2014/0006863 A1 Jan. 2, 2014

(30) Foreign Application Priority Data

Jun. 28, 2012 (KR) ........................ 10-2012-0069818

(51) Int. Cl.
*G01R 31/28* (2006.01)
*G11C 29/10* (2006.01)
*G11C 29/14* (2006.01)
*G11C 29/36* (2006.01)

(52) U.S. Cl.
CPC ................ *G11C 29/10* (2013.01); *G11C 29/14* (2013.01); *G11C 29/36* (2013.01)
USPC ........................... 714/726; 714/718; 714/732

(58) Field of Classification Search
CPC ................ G01R 31/318536; G01R 31/318541
USPC .................................. 714/726, 718, 740, 732
See application file for complete search history.

(56) References Cited

U.S. PATENT DOCUMENTS

| | | | |
|---|---|---|---|
| 5,694,402 A * | 12/1997 | Butler et al. | 714/732 |
| 6,661,839 B1 * | 12/2003 | Ishida et al. | 375/240 |
| 7,509,546 B2 * | 3/2009 | Rajski et al. | 714/718 |
| 7,900,104 B2 * | 3/2011 | Rajski et al. | 714/726 |

FOREIGN PATENT DOCUMENTS

| KR | 1020070060855 A | 6/2007 |
|---|---|---|
| KR | 100915822 B1 | 8/2009 |

* cited by examiner

*Primary Examiner* — Fritz Alphonse
(74) *Attorney, Agent, or Firm* — William Park & Associates Patent Ltd.

(57) ABSTRACT

A semiconductor memory apparatus includes a test circuit configured to receive a plurality of sequentially-changing test input patterns, compress the received test input patterns at each clock signal, and output the compressed patterns as variable test data.

20 Claims, 5 Drawing Sheets

FIG.5

| CLK | 0 | 1 | 2 | 3 | 4 | 5 | 6 | 7 |
|---|---|---|---|---|---|---|---|---|
| T0 | 1 | 0 | 0 | 1 | 0 | 0 | 1 | 0 |
| T1 | 1 | 0 | 1 | 1 | 0 | 1 | 0 | 1 |
| T2 | 1 | 1 | 0 | 0 | 0 | 1 | 0 | 1 |
| T3 | 0 | 1 | 1 | 0 | 0 | 0 | 0 | 1 |
| T_OUT | 0 | 0 | 1 | 0 | 1 | 1 | 0 | 1 |

TEST CIRCUIT OF SEMICONDUCTOR MEMORY APPARATUS AND SEMICONDUCTOR MEMORY SYSTEM INCLUDING THE SAME

CROSS-REFERENCES TO RELATED APPLICATION

The present application claims priority under 35 U.S.C. §119(a) to Korean application number 10-2012-0069818 filed on Jun. 28, 2012 in the Korean Intellectual Property Office, which is incorporated herein by reference in its entirety.

BACKGROUND

1. Technical Field

The present invention generally relates to a semiconductor memory system, and more particularly, to a test circuit of a semiconductor memory system.

2. Related Art

According to the recent semiconductor integrated circuit technology, a memory and a processor may be integrated into one chip, thereby reducing noise and uncertainty which may occur between the memory and the processor during signal transmission. The technology for integrating heterogeneous electronic circuit blocks into a single chip may include SoC (System on Chip) or SiP (System in Package). The SoC or SiP may effectively reduce a chip area and realize a high integration degree, and the market thereof is being gradually expanded.

FIG. 1 is a configuration diagram of a conventional semiconductor memory system in which a memory and a processor are integrated.

The semiconductor memory system includes a processor 10 and a stacked memory 20 which are mounted over a substrate 40 including a plurality of external connection terminals 41. At this time, the semiconductor memory system may further include an interposer 30 to connect the substrate 40 to the processor 10 and the stacked memory 20. The processor 10 and stacked memory 20 may also comprise input/output sections (I/O) for communications.

Referring to FIG. 1, there is no connection path through which a memory can be individually accessed from outside, after the semiconductor memory system is packaged. Therefore, it is impossible to perform a probe test using the existing equipment. Accordingly, a test method has been adopted, in which a test circuit is inserted into the semiconductor memory system and a test result obtained by the test circuit is checked through a test pin of the substrate 40.

FIG. 2 is a block diagram of a conventional boundary scan test circuit.

The boundary scan test circuit is a test circuit which to verify a signal input path between a processor and a memory inside a semiconductor memory system, and may be inserted into the memory, for example.

The boundary scan test circuit illustrated in FIG. 2 includes a latch unit 21 and a transmission unit 22.

The latch unit 21 includes a plurality of latches LAT1 to LATn, and the transmission unit 22 includes a plurality of flip-flops F/F1 to F/Fn connected between the respective latches LAT1 to LATn and configured to operate in synchronization with a test clock SCLK. The latches LAT1 to LATn are configured to output one signal among input signals received through input pins I/O_0, I/O_1, . . . , I/O_n and output signals of the respective flip-flops F/F1 to F/Fn connected thereto, in response to a control signal SSH. The control signal SSH is a signal for selectively outputting the input signals of the latch unit 21. Logic0 is an initial setting signal. The latch unit 21 outputs the Logic0 and the output signals of the flip-flops F/F1 to F/Fn when the control signal SSH is activated, and outputs the input signals received through the respective input pins I/O_0, I/O_1, . . . , I/O_n when the control signal SSH is deactivated.

FIG. 3 is a waveform diagram illustrating a test operation of the boundary scan test circuit.

When the control signal SSH is deactivated at a low level, the latch unit 21 transmits the input signals received through the input pins I/O_0, I/O_1, . . . , I/O_n to the transmission unit 22. Therefore, the flip-flops F/F1 to F/Fn receive the input signals received through the respective input pins I/O_0, I/O_1, . . . , I/O_n. Then, when the control signal SSH is activated at a high level, the latch unit 21 transmits the output signals of the flip flips F/F1 to F/FN to the transmission unit 22. Furthermore, when the test clock signal SCLK is enabled, the respective flip-flops F/F1 to F/Fn store and output the received data in synchronization with the test clock signal SCLK.

As a result, test data SOUT are serially outputted (i.e., 0, 1, 2, 3, 4 . . . ) through an output unit. At this time, the output unit outputs the input signal received through the input pin I/O_n adjacent to the output unit as 0-th test data SOUT. Furthermore, the output unit outputs the input signals received through the respective input pins as first to n-th test data SOUT according to the order of the input pins adjacent to the output unit.

In such a method, however, the test clock signal having a low frequency is used separately from a normal clock signal, and a time required for serially outputting the output signals additionally occurs. Therefore, it is impossible to perform a high-speed test capable of simultaneously checking all of the signal input paths according to a time flow. Therefore, it was impossible to normally check an issue related to speed, such as a coupling issue or margin issue. However, an actual clock signal at which a processor and a memory operate is faster than the test clock signal, and a new test method is urgently required to guarantee the reliability of continuous signal transmission operations at such a high frequency.

The new test method may include a loopback test method of directly feeding back a transmitted signal to the same path through a bi-directional I/O unit provided between a processor and a memory. However, the loopback test method may be performed only when the bi-directional I/O unit is provided. Therefore, there is a demand for a method for performing a high-speed test for a uni-directional I/O unit.

SUMMARY

In an embodiment, a semiconductor memory apparatus includes a test circuit configured to receive a plurality of sequentially-changing test input patterns, compress the received test input patterns at each clock signal, and output the compressed patterns as variable test data.

In an embodiment, a test circuit of a semiconductor memory apparatus includes: a plurality of input units configured to receive a plurality of sequentially-changing test input patterns, respectively, during a test mode; and a compression unit including a plurality of XOR gates configured to receive the respective test input patterns received by the input units and a plurality of registers alternately connected to the XOR gates and forming a chain structure, and configured to finally output an output signal of the register positioned at the last stage as test data, wherein one or more of the XOR gates receive the test data and perform a logic operation on the received signals.

In an embodiment, a semiconductor memory system includes: a stacked memory including one or more memories; a processor configured to control the stacked memory; and a substrate having the processor and the stacked memory mounted thereon, wherein the stacked memory includes a test circuit configured to receive a plurality of sequentially-changing test input patterns from the processor during a test mode, compress the received patterns at each clock signal, and output the compressed patterns as test data.

In an embodiment, a semiconductor memory system includes: a stacked memory including one or more memories; a processor configured to control the stacked memory; and a substrate having the processor and the stacked memory mounted thereon, wherein the processor includes a test circuit configured to receive a plurality of sequentially-changing test input patterns from the substrate during a test mode, compress the received patterns at each clock signal, and output the compressed patterns as variable test data.

BRIEF DESCRIPTION OF THE DRAWINGS

Features, aspects, and embodiments are described in conjunction with the attached drawings, in which:

FIG. 5 is a table showing inputs and outputs of the test circuit of FIG. 4; and

DETAILED DESCRIPTION

Hereinafter, a test circuit of a semiconductor memory apparatus and a semiconductor memory system including the same according to various embodiments will be described below with reference to the accompanying drawings through the various embodiments.

Figure 4:
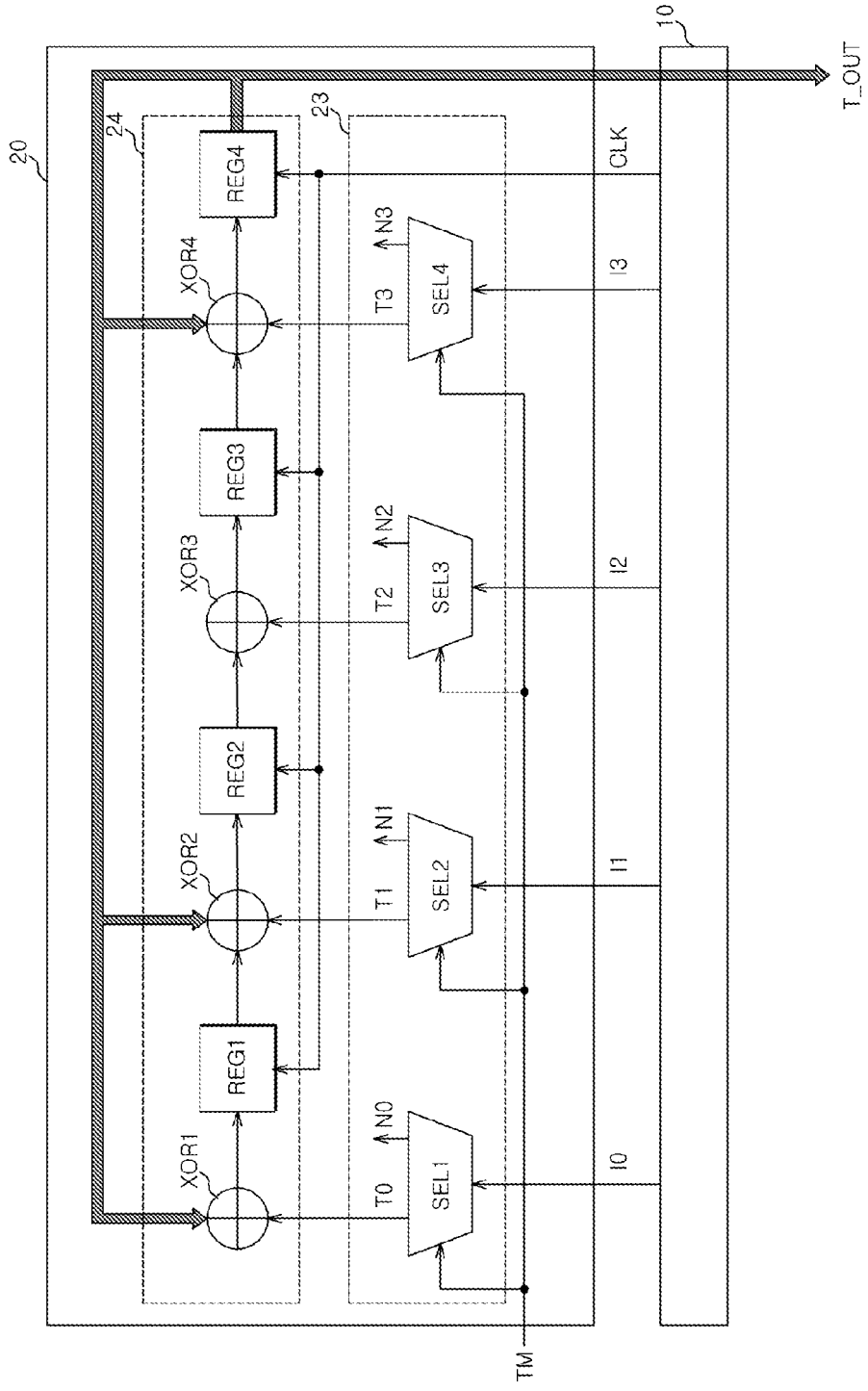
FIG. 4 is a block diagram of a test circuit and a semiconductor memory system including the same according to an embodiment.

FIG. 4 is a block diagram of a test circuit and a semiconductor memory system including the same according to an embodiment.

Figure 1:
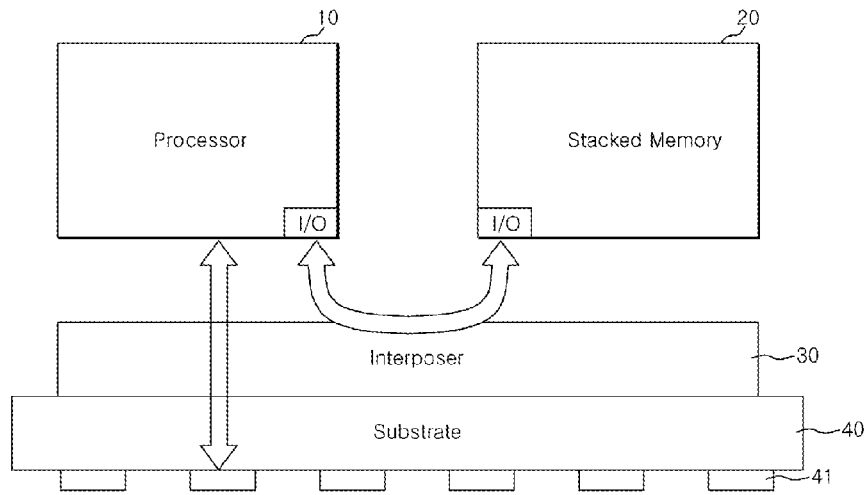
FIG. 1 is a configuration diagram of a conventional semiconductor memory system.
Figure 2:
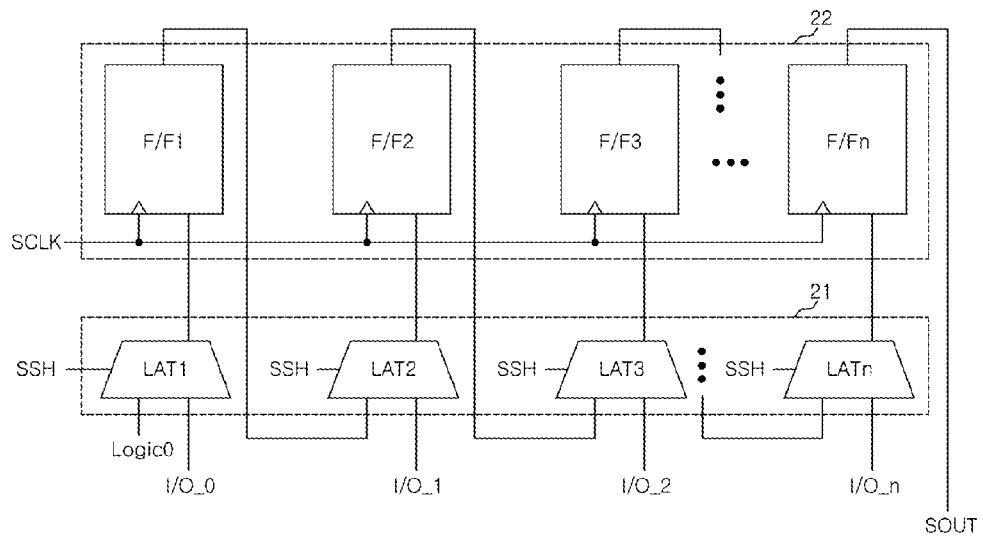
FIG. 2 is a block diagram of a conventional boundary scan test circuit.
Figure 3:
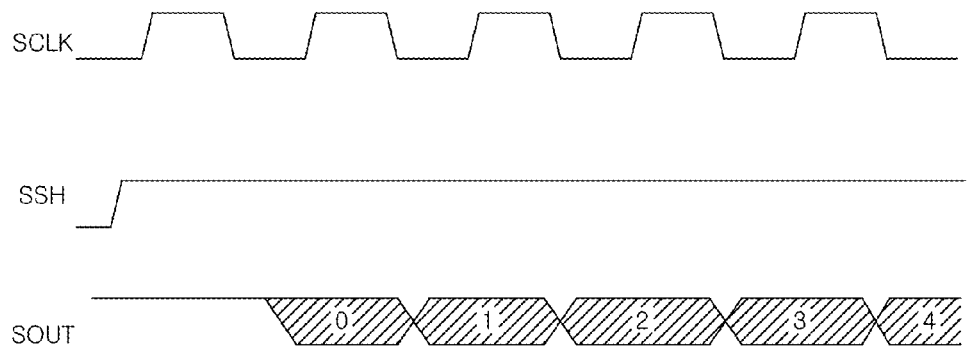
FIG. 3 is a waveform diagram illustrating a test operation of the boundary scan test circuit of FIG. 2.

FIG. 4 illustrates an embodiment of a test circuit configured to verify a signal input path between a processor 10 and a memory 20 in the semiconductor memory system of FIG. 1. That is, according to an embodiment, a plurality of input signals are simultaneously applied to a test circuit included in the memory 20 from the processor 10, and a test result is outputted to the outside. Accordingly, a high-speed test may be performed. At this time, the input signals applied to the memory 20 from the processor 10 may include an address indicating a specific memory cell address or a command signal to command a specific operation. In addition, the test circuit may perform a test on transmission paths of various input signals.

The test circuit illustrated in FIG. 4 may be included in the memory 20, and may include an input unit 23 and a compression unit 24.

The memory 20 may be configured to receive normal input signals from the processor 10 during a normal mode and receive a plurality of sequentially-changing test input patterns from the processor 10 during a test mode, through input pins I0 to I3.

The input unit 23 may be configured to decide whether to apply the input signals to the test circuit or a normal circuit, depending on whether or not the semiconductor memory system entered the test mode. That is, the input unit 23 may decide whether or not to enable the test circuit. For example, the input unit 23 receives the plurality of test input patterns and supplies the received patterns as test patterns T0 to T3 to the compression unit 24 or receives normal input signals and outputs the received signals as normal signals N0 to N3 to the inside such that the memory performs a normal operation, according to whether a test mode signal TM is activated or not.

Additionally, the input unit 23 may include a plurality of selectors SEL1 to SEL4 configured to select the signals received through the input pins I0 to I3 as the test patterns T0 to T3 or the normal signals N0 to N3 in response to the test mode signal TM.

The compression unit 24 may be configured to receive the plurality of sequentially-changing test patterns T0 to T3, compress the received test patterns at each clock signal CLK, and output the compressed patterns as variable test data T_OUT. At this time, a normal clock signal used during a normal operation of the semiconductor memory system is used as the clock signal CLK, which makes it possible to enable a high-speed test. Additionally, the clock signal CLK may be applied from the processor 10. The outputted test data T_OUT is transmitted to the outside through external connection terminals 41 of a substrate 40. Therefore, the plurality of test input patterns may be applied through the processor 10, and whether or not the test data T_OUT are outputted according to patterns set in response to the test input patterns may be determined outside, thereby continuously determining whether or not a defect occurs in the input paths.

In addition, when the test data T_OUT based on the preset patterns are not outputted but different data is outputted, it is possible to discriminate a path having a defect by applying newly-set test input patterns to determine which signal input path has a defect.

The compression scheme of the compression unit 24 to generate one output signal by compressing a plurality of input signals is disclosed in various existing papers. The basic concept of the compression scheme was described in detail in "Aliasing in Signature Analysis Testing with Multiple Input Shift Registers" submitted to IEEE by Maurizio Damiani, Piero Olive, Michele Favally, Silvia Ercolani and Bruno Ricco, on December, 1990.

FIG. 4 illustrates a specific example of the compression unit 24. The compression unit 24 includes a plurality of XOR gates XOR1 to XOR4 (i.e., exclusive OR gates) and a plurality of registers REG1 to REG4. The plurality of XOR gates XOR1 to XOR4 are configured to receive the respective test patterns T0 to T3, and the plurality of registers REG1 to REG4 are alternately connected to the XOR gates XOR1 to XOR4, thereby forming a chain structure. The compression unit 24 finally outputs an output signal of the last register REG4 as the test data T_OUT. At this time, one or more of the XOR gates XOR1 to XOR4 receive the test data T_OUT and perform an XOR operation on the received signals. As such, a feedback loop to feed back an output signal may be provided to increase the precision and reliability of the compression result.

In an embodiment, the compression unit 24 including four XOR gates XOR1 to XOR4 and four registers REG1 to REG4 was given as an example.

Additionally, the XOR gates XOR1 to XOR4 are logic elements which output 0 when input signals have the same level, and output 1 when any one of the input signals has a different level. Therefore, the XOR gates XOR1 to XOR4 perform a logic operation on the respective received test patterns T0 to T3 and output signals of the registers REG1 to REG4 positioned at the previous stage, and apply the operation results to the registers REG1 to REG4 positioned at the next stage. At this time, the first XOR gate XOR1 positioned in the head receives the first test pattern T0 and the output signal of the fourth register REG4 positioned in the tail, that is, the test data T_OUT. Furthermore, the test data T_OUT may be fed back to the second and fourth XOR gates XOR2 and XOR4.

The registers REG1 to REG4 store the output signals of the respective XOR gates XOR1 to XOR4 positioned at the previous stage, and sequentially output the stored signals at each clock signal CLK. Therefore, it is possible to output the test data T_OUT which changes according to the plurality of sequentially-changing test patterns T0 to T3. At this time, the registers REG1 to REG4 may be reset to a value of 0.

FIG. 5 is a table showing the I/O relationship based on the test circuit.

At each clock signal CLK, the plurality of test patterns T0 to T3 sequentially change to preset values. As a result, the test circuit outputs the test data T_OUT which changes according to a preset pattern at each clock signal CLK. When the test circuit does not form the above-described test data T_OUT even though the test circuit receives the input signals as shown in the table, it means that the signal input path has a defect. For example, at the clock signal CLK 0 the test pattern zero T0 is 1, test pattern one T1 is 1, test pattern two T2 is 1, test pattern 3 T3 is 0, and thus the test circuit outputs 0 for the test data T_OUT (please note, these values can be similarly interpreted for clock signals CLK 1 to 7 etc.).

The test circuit for signal input paths between the processor 10 and the memory 20 of the semiconductor memory system has been described with reference to FIG. 4. However, the test method is not only applied between the processor and the memory, but may also be applied between all electronic circuit blocks having a uni-directional signal input path.

Figure 6:
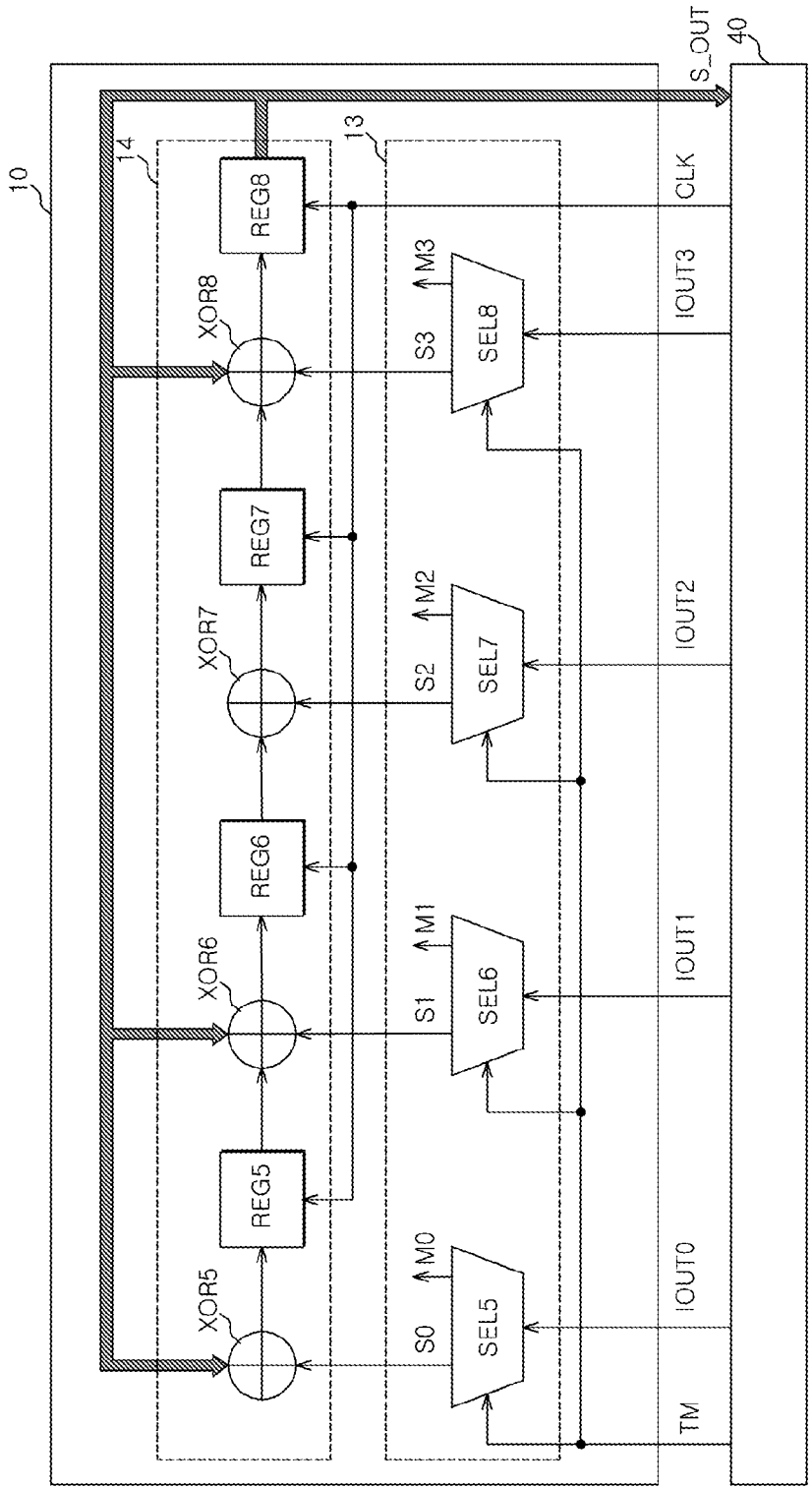
FIG. 6 is a block diagram of a test circuit and a semiconductor memory system including the same according to an embodiment.

FIG. 6 illustrates a test circuit configured to verify signal input paths between the substrate 40 and the processor 10 in the semiconductor memory system of FIG. 1. That is, according to an embodiment, a plurality of input signals are applied to the test circuit included in the processor 10 from the substrate 40, and a test result is outputted to the outside. Therefore, a high-speed test may be performed.

The test circuit illustrated in FIG. 6 may be included in the processor 10, and may include an input unit 13 and a compression unit 14.

The processor 10 receives normal input signals from the substrate 40 during a normal mode and receives a plurality of sequentially-changing test input patterns from the substrate 40 during a test mode, through input pins IOUT0 to IOUT3.

The input unit 13 may be configured to decide whether to apply the input signals to the test circuit or a normal circuit, depending on whether the semiconductor memory system enters the test mode. That is, the input unit 13 decides whether or not to enable the test circuit. For example, the input unit 13 receives the plurality of test input patterns and supplies the received patterns as test patterns S0 to S3 to the compression unit 14 or receives normal input signals and outputs the received signals to the inside such that the memory apparatus performs a normal operation, according to whether a test mode signal TM applied from the substrate 40 is activated or not.

Additionally, the input unit 13 may include a plurality of selectors SEL5 to SEL8 configured to select the input signals received through the input pins as the test patterns S0 to S3 or normal inputs M0 to M3, in response to the test mode signal TM.

The compression unit 14 may be configured to receive a plurality of sequentially-changing test patterns S0 to S3, compress the received patterns at each clock signal CLK, and output the compressed patterns as variable test data S_OUT. At this time, as a normal clock signal used during a normal operation of the semiconductor memory system is used as the clock signal CLK, a high-speed test may be performed. The clock signal CLK may be applied from the substrate 40. The outputted test data S_OUT are transmitted to the outside through external connection terminals 41 of the substrate 40. Therefore, the plurality of test input patterns may be applied from the substrate 40, and whether or not the test data S_OUT is outputted according to the pattern set in response to the test input patterns may be determined outside. Accordingly, it is possible to continuously determine whether or not the input paths have a defect.

Furthermore, when the test data TOUT based on the preset patterns are not outputted but different data are outputted, it is possible to discriminate a path having a defect by applying newly-set test input patterns to determine which signal input path has a defect.

The basic concept, configuration, and operation of the compression scheme of the compression unit 14 have been already described with reference to FIG. 4. That is, the compression unit 14 includes a plurality of XOR gates XOR5 to XOR8 and a plurality of registers REG5 to REG8. The plurality of XOR gates XOR5 to XOR8 are configured to receive the respective test patterns S0 to S3, and the plurality of registers REG5 to REG8 are alternately connected to the XOR gates XOR5 to XOR8, thereby forming a chain structure. The compression unit 14 finally outputs an output signal of the last register REG8 as the test data S_OUT. At this time, one or more of the XOR gates XOR5 to XOR8 receive the test data S_OUT and perform an XOR operation on the received signals. As such, a feedback loop to feed back an output signal may be provided to increase the precision and reliability of the compression result.

According to an embodiment, whether or not various internal input paths of the semiconductor memory system have a defect may be determined outside at each clock signal.

While certain embodiments have been described above, it will be understood to those skilled in the art that the embodiments described are by way of example only. Accordingly, the semiconductor memory apparatus described herein should not be limited based on the described embodiments.

What is claimed is:

1. A test circuit of a semiconductor memory apparatus, comprising:
a plurality of input units configured to receive a plurality of sequentially-changing test input patterns, respectively, during a test mode; and
a compression unit comprising a plurality of XOR gates configured to receive the respective test input patterns received by the input units and a plurality of registers alternately connected to the XOR gates and forming a chain structure, and configured to finally output an output signal of the register positioned at the last stage as test data, wherein each of the XOR gates performs a logic operation on the received test input pattern and an output signal of the register positioned at the previous stage, and applies the operation result to the register positioned at the next stage, and one or more of the XOR gates receive the test data and perform a logic operation on received signals.

2. The test circuit according to claim 1, wherein the input unit is configured to enable the test circuit and enter a test mode when an activated test mode signal is received.

3. The test circuit according to claim 1, wherein the registers store output signals of the respective XOR gates positioned at the previous stage, and sequentially output the output signals at each clock signal.

4. The test circuit according to claim 3, wherein the clock signal comprises a normal clock used during a normal operation of the semiconductor memory apparatus.

5. A semiconductor memory system comprising:
a stacked memory comprising one or more memories;
a processor configured to control the stacked memory; and
a substrate having the processor and the stacked memory mounted thereon,
wherein the stacked memory comprises a test circuit configured to receive a plurality of sequentially-changing test input patterns from the processor during a test mode, compress the received patterns at each clock signal, and output the compressed patterns as test data.

6. The semiconductor memory system according to claim 5, wherein the test circuit comprises an input unit configured to enable the test circuit and enter a test mode when an activated test mode signal is received.

7. The semiconductor memory system according to claim 5, wherein the test data is transmitted to the outside through an external connection terminal of the substrate.

8. The semiconductor memory system according to claim 5, wherein, when receiving the plurality of test input patterns from the processor, the test circuit determines whether or not the test data set in response to the test input patterns is outputted, thereby deciding whether or not a signal input path of the stacked memory has a defect.

9. The semiconductor memory system according to claim 5, wherein the test circuit comprises a plurality of XOR gates configured to receive the respective test input patterns and a plurality of registers alternately connected to the XOR gates and forming a chain structure, and configured to finally output an output signal of the register positioned at the last stage as test data.

10. The semiconductor memory system according to claim 9, wherein each of the XOR gates performs a logic operation on the received test input pattern and an output signal of the register positioned at the previous stage, and applies the operation result to the register positioned at the next stage, and one or more of the XOR gates receive the test data and perform a logic operation on the received signals.

11. The semiconductor memory system according to claim 9, wherein the registers store output signals of the respective XOR gates positioned at the previous stage, and sequentially output the output signals at each clock signal.

12. The semiconductor memory system according to claim 5, wherein the test circuit receives a plurality of sequentially-changing address test input patterns from the processor through an address input unit, during a test mode.

13. The semiconductor memory system according to claim 5, wherein the test circuit receives a plurality of sequentially-changing command test input patterns from the processor through a command input unit, during a test mode.

14. A semiconductor memory system comprising:
a stacked memory comprising one or more memories;
a processor configured to control the stacked memory; and
a substrate having the processor and the stacked memory mounted thereon,
wherein the processor comprises a test circuit configured to receive a plurality of sequentially-changing test input patterns from the substrate during a test mode, compress the received patterns at each clock signal, and output the compressed patterns as variable test data.

15. The semiconductor memory system according to claim 14, wherein the test circuit comprises an input unit configured to enable the test circuit and enter a test mode when an activated test mode signal is received.

16. The semiconductor memory system according to claim 14, wherein the test data is transmitted to the outside through an external connection terminal of the substrate.

17. The semiconductor memory system according to claim 14, wherein, when receiving the plurality of test input patterns from the substrate, the test circuit determines whether or not the test data set in response to the test input patterns is outputted, thereby deciding whether or not a signal input path of the processor has a defect.

18. The semiconductor memory system according to claim 14, wherein the test circuit comprises a plurality of XOR gates configured to receive the respective test input patterns and a plurality of registers alternately connected to the XOR gates and forming a chain structure, and configured to finally output an output signal of the register positioned at the last stage as test data.

19. The semiconductor memory system according to claim 18, wherein each of the XOR gates performs a logic operation on the received test input pattern and an output signal of the register positioned at the previous stage, and applies the operation result to the register positioned at the next stage, and one or more of the XOR gates receive the test data and perform a logic operation on the received signals.

20. The semiconductor memory system according to claim 18, wherein the registers store output signals of the respective XOR gates positioned at the previous stage, and sequentially output the output signals at each clock signal.

* * * * *